(12) United States Patent
Dyer et al.

(10) Patent No.: US 7,943,474 B2
(45) Date of Patent: May 17, 2011

(54) EDRAM INCLUDING METAL PLATES

(75) Inventors: Thomas W. Dyer, Pleasant Valley, NY (US); Keith Kwong Hon Wong, Wappingers Falls, NY (US); Mahender Kumar, Fishkill, NY (US)

(73) Assignee: International Business Machines Corporation, Armonk, NY (US)

( * ) Notice: Subject to any disclaimer, the term of this patent is extended or adjusted under 35 U.S.C. 154(b) by 177 days.

(21) Appl. No.: 12/391,631

(22) Filed: Feb. 24, 2009

(65) Prior Publication Data

US 2010/0213571 A1    Aug. 26, 2010

(51) Int. Cl.
*H01L 21/20* (2006.01)
(52) U.S. Cl. ........ 438/386; 257/296; 257/301; 257/303; 257/306; 257/330; 257/E27.095; 257/E29.26; 257/E29.346; 257/E21.396; 257/E21.651; 438/243; 438/244; 438/259; 438/270; 438/387
(58) Field of Classification Search .............. 247/296, 247/301, 303, 306, 330, E27.095, E29.26, 247/E29.346, E21.396, E21.651; 438/243, 438/244, 259, 270, 386, 387
See application file for complete search history.

(56) References Cited

U.S. PATENT DOCUMENTS

| | | | |
|---|---|---|---|
| 6,359,300 B1 | 3/2002 | Economikos et al. | |
| 6,909,137 B2 | 6/2005 | Divakaruni et al. | |
| 7,078,289 B2 | 7/2006 | Hsu | |
| 2003/0045068 A1* | 3/2003 | Gutsche et al. | 438/386 |
| 2003/0060003 A1* | 3/2003 | Hecht et al. | 438/240 |
| 2004/0228067 A1* | 11/2004 | Gutsche et al. | 361/306.2 |
| 2005/0260812 A1* | 11/2005 | Kapteyn et al. | 438/243 |
| 2007/0007624 A1* | 1/2007 | Kapteyn et al. | 257/532 |

* cited by examiner

*Primary Examiner* — Lynne A Gurley
*Assistant Examiner* — Meiya Li
(74) *Attorney, Agent, or Firm* — Scully, Scott, Murphy & Presser, P.C.; H. Daniel Schnumann

(57) ABSTRACT

A method for forming a memory device is provided by first forming at least one trench in a semiconductor substrate. Next, a lower electrode is formed in the at least one trench, and thereafter a conformal dielectric layer is formed on the lower electrode.
An upper electrode is then formed on the conformal dielectric layer. The forming of the upper electrode may include a conformal deposition of metal nitride layer, and a non-conformal deposition of an electrically conductive material atop the metal nitride layer, in which the electrically conductive material encloses the at least one trench.

11 Claims, 5 Drawing Sheets

EDRAM INCLUDING METAL PLATES

FIELD OF THE INVENTION

The present invention generally relates to a method of fabricating a semiconductor memory device. More particularly, a method and structure are provided in which the lower electrode of the semiconductor memory device is formed by a conformally deposited metal nitride.

BACKGROUND OF THE INVENTION

Embedded memory devices fabricated within trench capacitors and/or vertical transistor cells have benefits over planar-stacked device structures. Trench capacitors have replaced the planar storage capacitor in order to meet the scaling demands for high performance DRAM (dynamic random access memory) cell production.

A trench capacitor is a three dimensional device formed by etching a trench into a semiconductor substrate. After trench etching, a buried plate electrode is formed about the exterior portion of the trench and a node dielectric is then formed on the inner walls of the trench. Next, the trench is filled, for example, with N-type polycrystalline silicon ("N-type Poly-Si"). In order to obtain sufficient capacitance, a dopant level of about $10^{19}$ atoms/cm$^3$ is commonly utilized. The doped poly-Si serves as one electrode of the capacitor, often referred to as the upper electrode or storage node. An N-type doped region surrounds the lower portion of the trench, serving as the second electrode and is referred to as the lower electrode or a "buried plate" or "diffusion plate". A node dielectric separates the buried plate and the upper electrode and serves as the insulating layer of the trench capacitor.

Currently, trench capacitors are formed within an integrated circuit by filling the previously formed trench with appropriately doped poly-Si. A common method for depositing poly-Si, for the upper electrode, is by chemical vapor deposition. A disadvantage associated with this prior method is that the poly-Si upper electrode has a relatively high electrical resistivity as compared to elemental metals. The high electrical resistivity of the poly-Si material, as the top electrode, accordingly limits the speed of the resulting device. Other disadvantages associated with the use of doped poly-Si, as an upper electrode material, include, for example, leakage due to parasitic transistors and gate depletion effects. Both of these phenomenons decrease the capacitance of the device.

SUMMARY OF THE INVENTION

A memory device is provided, in which the upper electrode of the memory device is present in a trench and is composed of a conformally deposited metal nitride layer and an electrically conductive material. The electrically conductive material is deposited atop the metal nitride layer to enclose the at least one trench. Broadly, the method includes:
forming a lower electrode in at least one trench that is located in a semiconductor substrate;
forming a conformal dielectric layer on the lower electrode; and
forming an upper electrode on the conformal dielectric layer, wherein the forming of the upper electrode includes conformal deposition of a metal nitride layer, and a non-conformal deposition of an electrically conductive material atop the metal nitride layer, wherein the electrically conductive material encloses the at least one trench.

In another aspect, a memory device is provided within a trench, wherein the memory device includes an upper electrode that is composed of a conformal metal nitride layer and an electrically conductive material. The electrically conductive material is positioned atop the conformal metal nitride layer to enclose a void in a lower portion of the trench.

Broadly, the memory device includes:
at least one trench located in a semiconductor substrate including an aspect ratio of about 3:1 or greater;
a lower electrode present in the at least one trench;
a conformal dielectric layer located on the lower electrode; and
an upper electrode including a conformal metal nitride layer located on the conformal dielectric layer in a lower portion of the at least one trench, the conformal metal nitride layer including a thickness ranging from 3 nm to 30 nm, and an electrically conductive material capping the conformal metal nitride layer, wherein a void is enclosed in the lower portion of the at least one trench.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION OF THE INVENTION

Figure 1:
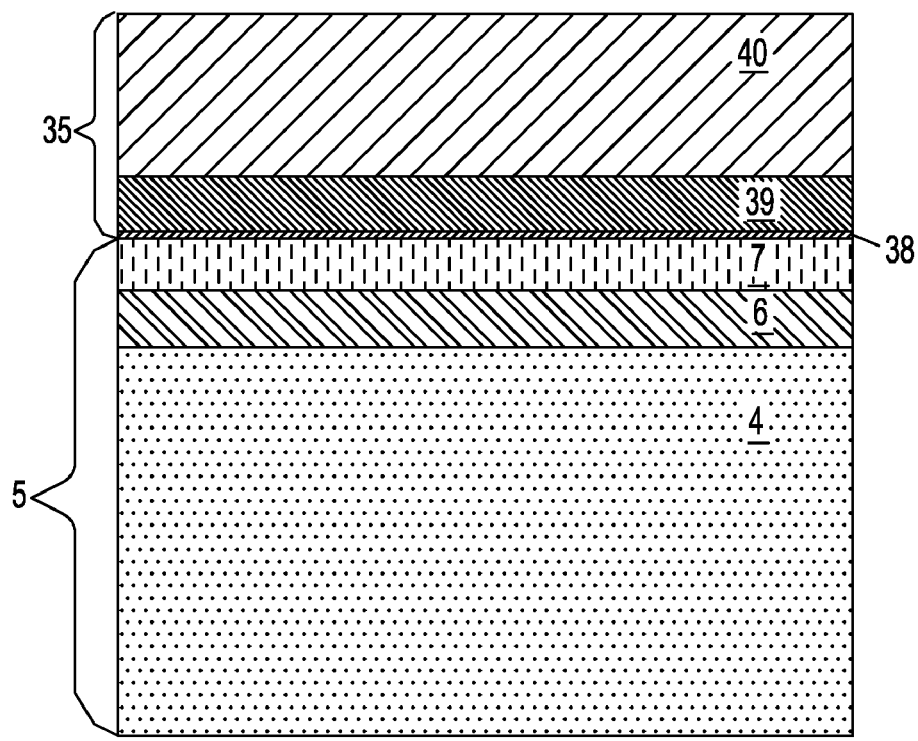
FIG. 1 is a side cross-sectional view depicting a semiconductor substrate having a pad dielectric stack disposed thereon, in accordance with the present invention.

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The embodiments of the present invention relate to novel methods and structures relating to memory devices. When describing the methods, the following terms have the following meanings, unless otherwise indicated.

As used herein, the term "memory device" means a structure in which the electrical state thereof can be altered and then retained in the altered state; in this way a bit of information can be stored.

"Volatile memory" means memory in which stored information is lost when power to the memory device is turned off.

"Non-volatile memory" means information stored is maintained after the power supply is turned off.

As used herein, "insulating" and "dielectric" denote a material having a room temperature conductivity of less than about $10^{10} (\Omega\text{-m})^{-1}$.

"Electrically conductive" and/or "electrically communicating" as used through the present disclosure means a material having a room temperature conductivity of greater than $10^{-8}(\Omega\text{-m})^{-1}$.

As used herein, a "metal" is an electrically conductive material, wherein metal atoms are held together by the force of a metallic bond, and the energy band structure of metal's conduction and valence bands overlap, and hence, there is no energy gap.

The term "undercut region" denotes a material removal that extends underneath an overlying structure.

As used herein, "conformal layer" is a deposited material having a thickness that remains the same regardless of the geometry of underlying features on which the layer is deposited, wherein the thickness of the layer does not deviate from greater than or less than 20% of an average value for the thickness of the layer.

As used herein, "conformally deposited" or "conformal deposition" refers to a deposition method for forming a conformal layer.

The term "aspect ratio" means the ratio of the height of a trench to the width of the trench.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the invention, as it is oriented in the drawing figures.

FIGS. 1-10 depict one embodiment of a method of forming a memory device 100. The method begins with forming at least one trench 10 in a semiconductor substrate 5 and forming a lower electrode 15 in the at least one trench 10. The term "in the trench" when referring to the lower electrode is used here to denote that the lower electrode 15 can be around the perimeter of the trench or on the sidewalls of the trench. In a following step, a conformal dielectric layer 20 is then formed on the lower electrode 15. Thereafter, an upper electrode is formed on the conformal dielectric layer 20. Broadly, forming the upper electrode includes a conformal deposition of a metal nitride layer 25, and a non-conformal deposition of an electrically conductive material 30 atop the metal nitride layer 25, wherein the electrically conductive material 30 encloses the at least one trench 10. It is observed that these reference numbers mentioned above appear within FIGS. 1-10 of the present invention.

FIG. 1 depicts a semiconductor substrate 5 having a pad dielectric stack 35 present on the upper surface of the semiconductor substrate 5. The semiconductor substrate 5 may include any conventional semiconductor material known in the art including, but not limited to: Si, Ge, SiGe, GaAs, InAs, InP, or other III/IV compounds. The semiconductor substrate 5 may be doped with P or N-type dopants or may be undoped. In particular, the semiconductor substrate 5 may be lightly doped with P-type dopants, such as boron. The semiconductor substrate 5 may contain various isolation and/or active device regions. For clarity, such regions are not shown in the drawings, but are nevertheless meant to be included within the semiconductor substrate 5.

In the example depicted in FIG. 1, the semiconductor substrate 5 may be a semiconductor on insulator (SOI) substrate including a semiconductor layer 7 (also referred to as a semiconductor on insulator (SOI) layer), such as a silicon-containing semiconductor layer, abutting a buried insulating layer 6, such as a buried oxide layer. The semiconductor layer 7 typically has a thickness greater than 10 nm. The buried insulating layer 6 typically has a thickness ranging from 10 nm to 100 nm. Underlying the buried insulating layer 6 is a lower semiconductor layer 4, which may be composed of a Si-containing material, and may have a thickness ranging from 10 nm to 500 nm. The semiconductor on insulator substrate may be formed using a bonding process, or it may be formed using an ion implantation process.

The pad dielectric stack 35 may be formed on the surface of the semiconductor substrate 5 using deposition and/or thermal growth processes. The pad dielectric stack 35 can serve as an etch mask during formation of at least one trench 10 in the semiconductor substrate 5. The pad dielectric stack 35 may comprise a single pad dielectric layer, or the pad dielectric stack 35 may comprise a multilayered structure. For example, the dielectric stack 35 may comprise an oxide, a nitride, or a doped silicate glass material, or two or more of the aforementioned materials may be employed.

In the example depicted in FIG. 1, the pad dielectric stack 35 includes a first pad dielectric layer 38, e.g., a pad oxide layer, a second pad dielectric layer 40, e.g., a pad nitride layer, and a third pad dielectric layer 40, e.g., a high density plasma (HDP) chemical vapor deposition (CVD) deposited oxide. When the first pad dielectric layer 38 is composed of a pad oxide layer, the pad oxide layer may be silicon oxide having a thickness ranging from 1 nm to 10 nm, typically being 5 nm. When the second pad dielectric layer 39 is composed of a pad nitride layer, the pad nitride layer may be silicon nitride having a thickness ranging from 10 nm to 100 nm. When the third pad dielectric layer 40 is composed of HDPCVD oxide, the HDPCVD oxide may be silicon oxide having a thickness ranging from 10 nm to 500 nm.

Following the formation of the pad dielectric stack 35 on the surface of semiconductor substrate 5, the pad dielectric stack 35 is then patterned using conventional lithography and etching. A photolithographic mask (not shown) is produced, by applying a photoresist layer (not shown) on the exposed surface layer of the surface to be etched utilizing a conventional deposition process. The photoresist layer is then patterned utilizing conventional lithography so as to expose selective regions of the pad stack in which trenches are to be formed. The lithography step employed in the present invention includes exposing the photoresist to radiation to form a pattern in the photoresist and developing the pattern. The pattern (not shown) is then transferred into the layer of the pad dielectric stack 35 using a conventional etching process, such as reactive-ion etching (RIE), ion beam etching, plasma etching or laser ablation that is highly selective in removing pad material as compared to photoresist.

Figure 2:
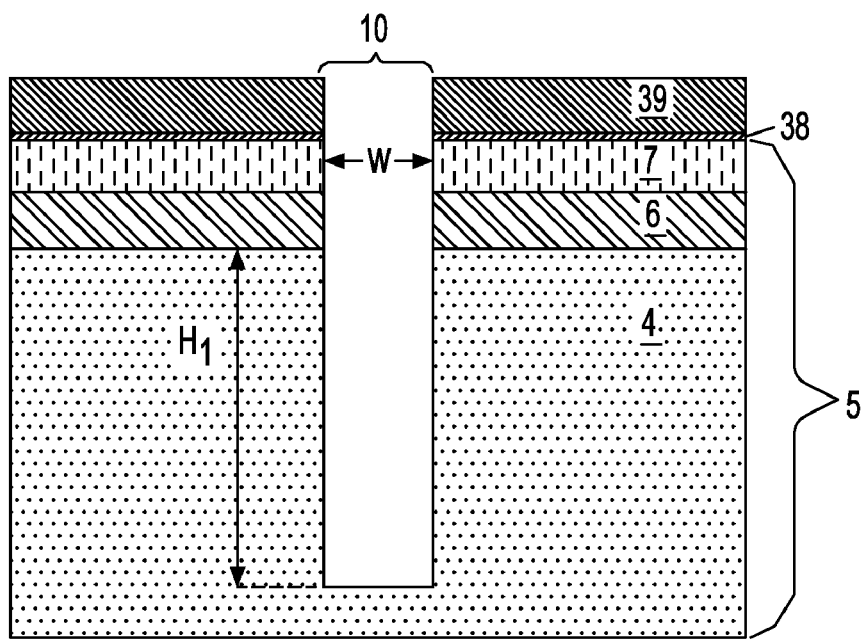
FIG. 2 is a side cross-sectional view depicting forming at least one trench in the semiconductor substrate, in accordance with the present invention.

FIG. 2 depicts forming at least one trench 10 in the semiconductor substrate 5. The at least one trench 10 may be formed using an etch process, such as an anisotropic etch process. As used herein, an "anisotropic etch process" denotes a material removal process in which the etch rate in the direction normal to the surface to be etched is much higher than in the direction parallel to the surface to be etched. Etching of the at least one trench 10 into the semiconductor substrate 5 may be performed using a timed etch process step that is highly selective in removing the material of the semiconductor substrate 5 as opposed to the material of the pad dielectric stack 35. Dry etching processes that may be used to form the at least one trench 10 includes, but is not limited to: RIE, ion-beam etching, plasma etching or any other like dry etch process. A combination of the aforementioned dry etch processes may also be used in providing the at least one trench 10.

In one embodiment of the present invention, the final depth $H_1$ of each of the at least one trench 10, as measured from the top surface of the semiconductor substrate 5 is as great as 10 µm. The final depth $H_1$ of each of the at least one trench 10, as measured from the top surface of the semiconductor substrate 5, may also range from 4 µm to 10 µm. The width W of each trench 10 may range from 30 nm to 150 nm. More typically, the width W of each trench 10 may range from 50 nm to 120 nm. The aspect ratio (height to width ratio) of the trench may range from 25:1 to 100:1. Even more typically, the aspect ratio ranges from 30:1 to 70:1. In one embodiment, the third pad dielectric 40 may be removed by the etch process that produces the at least one trench 10. Alternatively, the patterned pad stack is removed by a conventional stripping process. The photoresist can be removed after any of the etching steps mentioned above.

Figure 3:
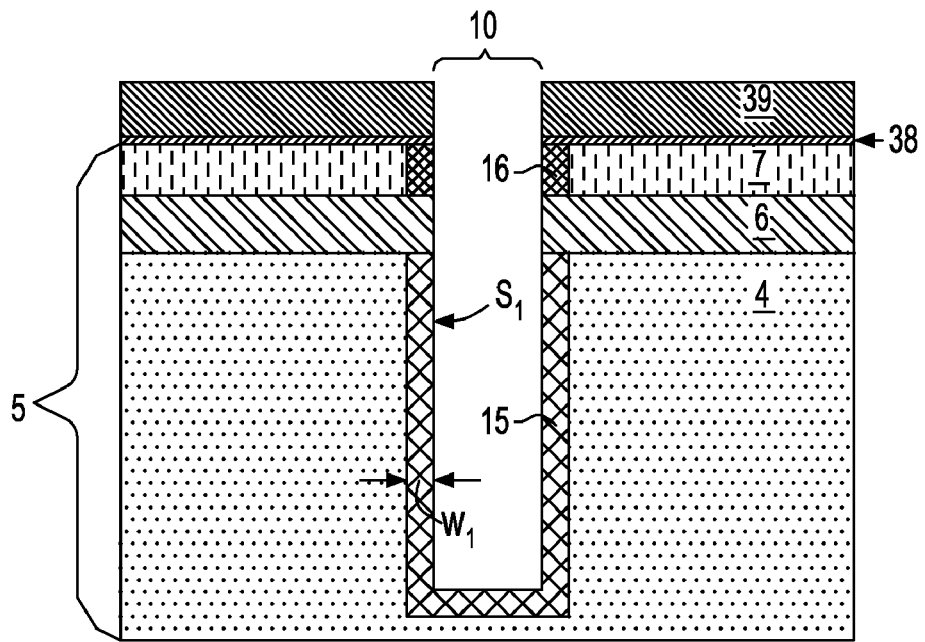
FIG. 3 is a side cross-sectional view depicting forming a lower electrode in the at least one trench in the semiconductor substrate, in accordance with one embodiment of the present invention.

FIG. 3 depicts forming a lower electrode 15 in the at least one trench 10 in the semiconductor substrate 5. In one embodiment, the lower electrode 15 may be formed on the outer sidewalls of the at least one trench 10 via ion implantation of n-type or p-type dopants into the semiconductor substrate 5 to provide a buried plate diffusion region. In one example, the lower electrode 15 may be provided by an N+ buried plate diffusion region that is formed about, i.e., within, the exterior walls of the at least one trench 10 using a process that is capable of diffusing N+ dopant through the trench walls. Producing the N+ buried plate diffusion region may begin with introducing a dopant source to the sidewalls of the at least one trench 10 and then thermally diffusing the dopant into the semiconductor substrate 5. In one example, in which the semiconductor substrate 5 is an SOI substrate, the lower electrode 15 is formed in the lower semiconductor layer 4.

The dopant source to produce the N+ buried plate diffusion region may be introduced by ion-implanting an impurity, such as arsenic (As) or phosphorus (P), into the sidewall of the at least one trench 10. Arsenic (As) may be ion-injected into the at least one trench 10 under the conditions of an accelerating voltage, of about 40 kV, and at a dose of about $10^{15}/cm^2$. Depositing a layer of N-type doped material, such as arsenic doped silicate glass, may also form the N+ buried plate diffusion region. After the impurities are introduced to the sidewalls of the at least one trench 10, the semiconductor substrate 5 is then heated in an $N_2$ atmosphere at a temperature of about 900° C. for about 30 minutes, thereby diffusing N-type dopants into the semiconductor substrate 5 and forming a N-type impurity buried plate diffusion region around the sidewalls of the at least one trench 10.

The width W1 of the buried plate diffusion region that provides the lower electrode 15 may range from 25 nm to 100 nm, as measured from the sidewall $S_1$ of the at least one trench 10. In one example, the width W1 of the buried plate diffusion region that provides the lower electrode 15 has a thickness of about 50 nm, as measured from the sidewall $S_1$ of the at least one trench 10.

In another embodiment, the lower electrode 15 is provided by a conformally deposited metal nitride layer. The conformally deposited metal nitride layer may be composed of titanium nitride (TiN), tantalum nitride (TaN), tantalum silicon nitride (TaSiN), tungsten nitride (WN) or a combination thereof. The conformally deposited metal nitride layer may have a resistance ranging from 20Ω to 500Ω. More typically, the conformally deposited metal nitride layer may have a resistance ranging from 50Ω to 150Ω. The width of the conformally deposited metal nitride layer that provides the lower electrode 15 may range from 3 nm to 30 nm, as measured from the sidewall $S_1$ of the at least one trench 10. More typically, the width of the conformally deposited metal nitride layer that provides the lower electrode 15 may have a thickness of about 10 nm.

The conformally deposited metal nitride layer for the lower electrode 15 may be provided using chemical vapor deposition (CVD), wherein the conformally deposited metal nitride layer is formed on the base and sidewalls of the at least one trench 10. Chemical vapor deposition (CVD) is a deposition process in which a deposited species is formed as a result of a chemical reaction between gaseous reactants at greater than room temperature, wherein solid product of the reaction is deposited on the surface on which a film, coating, or layer of the solid product is to be formed. Variations of CVD processes suitable for providing the conformally deposited metal nitride layer of the lower electrode 15 include, but are not limited to: Atmospheric Pressure CVD (APCVD), Low Pressure CVD (LPCVD), Plasma Enhanced CVD (EPCVD), Metal-Organic CVD (MOCVD), and combinations thereof. In another embodiment, the conformally deposited metal nitride layer for the lower electrode 15 is provided by atomic layer deposition (ALD). Atomic layer deposition (ALD) is a self-limiting, sequential surface chemistry deposition method that deposits conformal thin-films of materials. Atomic layer deposition (ALD) is similar in chemistry to chemical vapor deposition (CVD), except that the ALD reaction may break the CVD reaction into two half reactions, keeping the precursor materials separate during the reaction.

Still referring to FIG. 3, during the formation of the lower electrode 15, an electrically conductive doped region 16 may be formed in the semiconductor on insulator (SOI) layer 7. The electrically conductive doped region 16 may be doped with a dopant and concentration that is consistent with the N+ buried plate diffusion region that provides the lower electrode 15. In one embodiment, the electrically conductive doped region 16 may be omitted.

Figure 4:
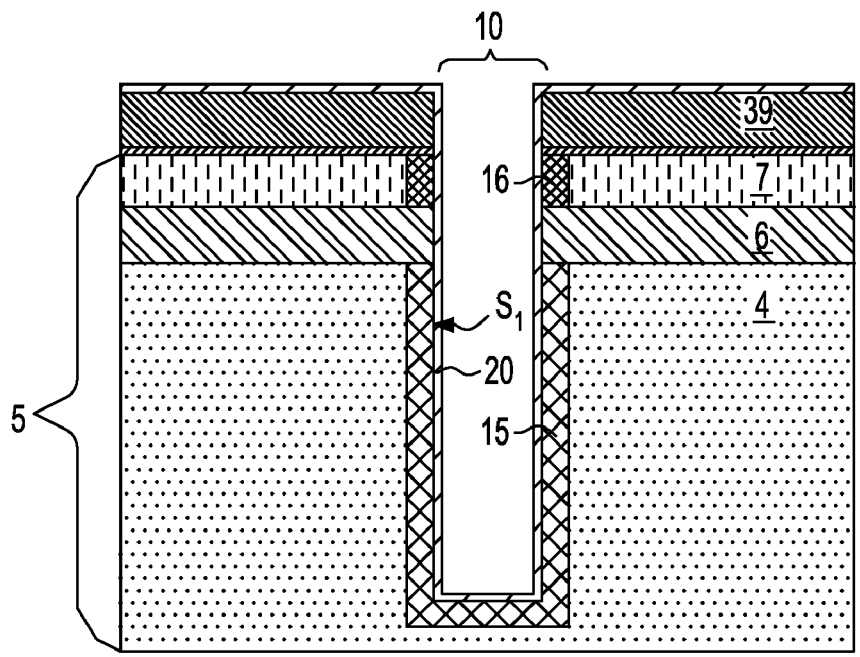
FIG. 4 is a side cross-sectional view depicting forming a dielectric layer, i.e., conformal dielectric layer, on the lower electrode, in accordance with one embodiment of the present invention.

FIG. 4 depicts forming a dielectric layer, i.e., conformal dielectric layer 20, on the lower electrode 15. The conformal dielectric layer 20 employed at this stage of the present invention may be any dielectric material including, but not limited to: $Si_3N_4$, $SiO_2$, $Al_2O_3$, $ZrO_2$, and $HfO_2$. In one embodiment, the conformal dielectric layer 20 may have a thickness of from 4.0 nm to 10.0 nm. The conformal dielectric layer 20 may have a thickness of from 2.5 nm to 7.0 nm, with a thickness of from 3.0 nm to 5.0 nm being more typical.

The conformal dielectric layer 20 is conformally deposited on the sidewalls and base of the at least one trench 10. In one embodiment, the conformal dielectric layer 20 may be deposited using chemical vapor deposition (CVD). Variations of CVD processes suitable for providing the conformal dielectric layer 20 include, but are not limited to: Atmospheric Pressure CVD (APCVD), Low Pressure CVD (LPCVD), Plasma Enhanced CVD (EPCVD), Metal-Organic CVD (MOCVD), atomic layer deposition, and combinations thereof. In another embodiment, the conformal dielectric layer 20 is formed using a growth process, such as thermal oxidation.

Figure 5:
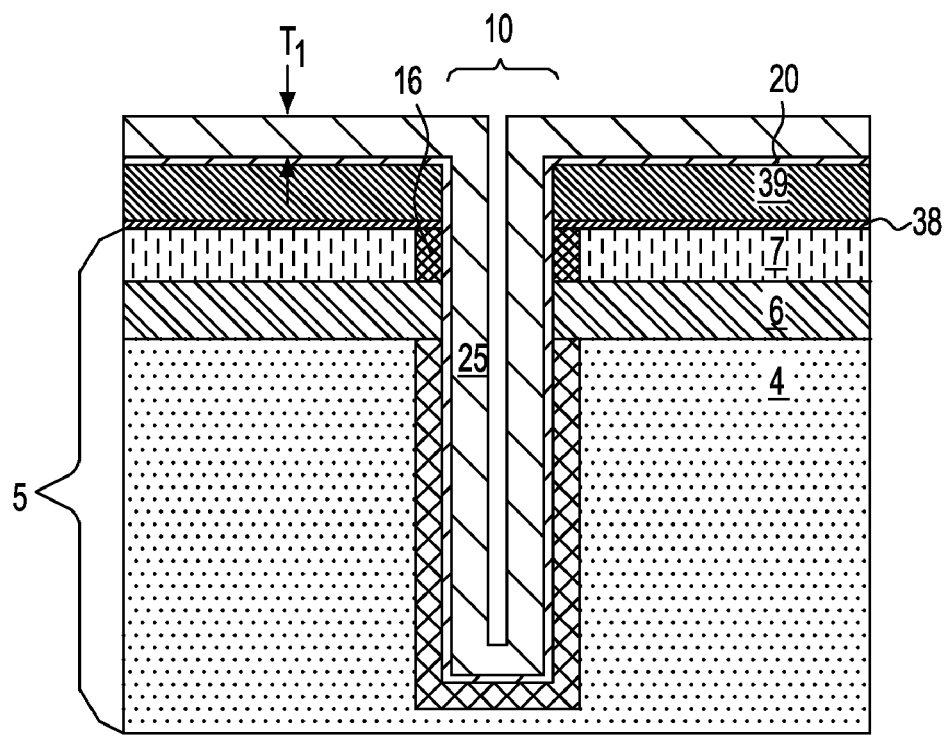
FIGS. 5 and 6 are side cross-sectional views depicting forming an upper electrode on the conformal dielectric layer, wherein the forming of the upper electrode includes a conformal deposition of a metal nitride layer, and a non-conformal deposition of an electrically conductive material overlying the metal nitride layer, wherein the electrically conductive material encloses the at least one trench, in accordance with the present invention.
Figure 6:
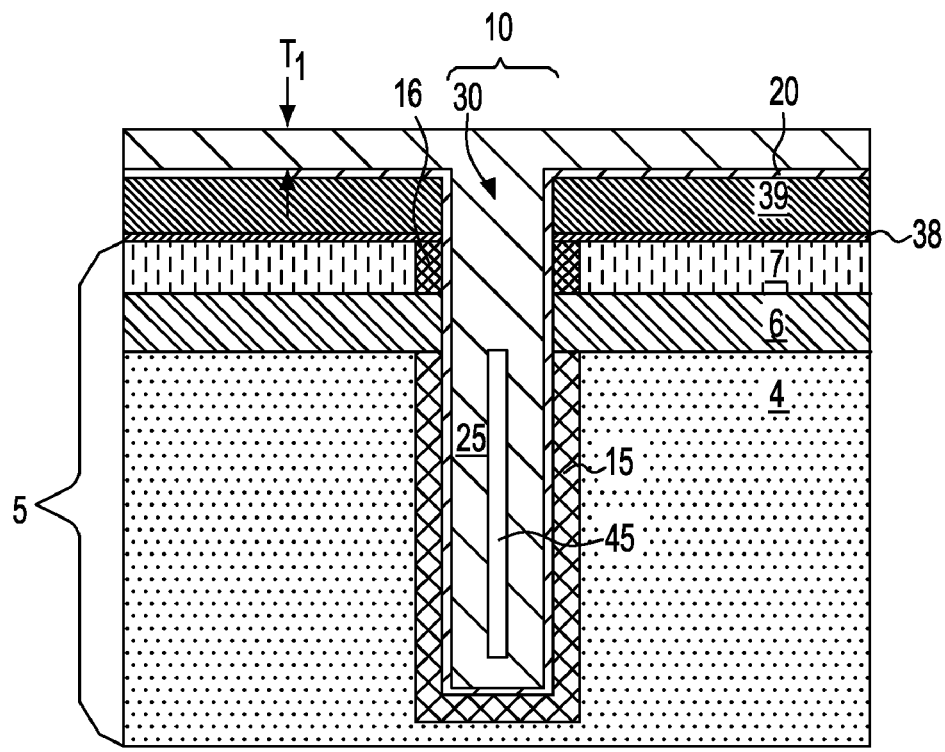

Referring to FIGS. 5 and 6, following the formation of the conformal dielectric layer 20, the upper electrode is then formed atop the conformal dielectric layer 20. The upper electrode is composed of a conformal metal nitride layer 25 and an electrically conductive material 30 that is formed capping the conformal metal nitride layer 25, wherein a void 45 is enclosed in the lower portion of the at least one trench 10.

FIG. 5 depicts a conformal deposition of a metal nitride layer, i.e., conformal metal nitride layer 25. The conformal metal nitride layer 25 may be composed of a metal nitride or a metal silicon nitride including, but not limited too: titanium nitride (TiN), tantalum nitride (TaN), tantalum silicon nitride (TaSiN), tungsten nitride (WN) or a combination thereof. In another example, the conformal metal nitride layer 25 may be molybdenum nitride ($MoN_x$). The conformal metal nitride layer 25 is typically deposited to a thickness $T_1$ ranging from 2 nm to 100 nm. In another embodiment, the conformal metal nitride layer 25 is typically deposited to a thickness $T_1$ ranging from 3 nm to 30 nm. In another embodiment, the conformal metal nitride layer 25 is typically deposited to a thickness $T_1$ ranging from 10 nm to 30 nm. In another example, the conformal metal nitride layer 25 is deposited to a thickness of about 50 nm.

The conformal metal nitride layer 25 may be deposited by chemical vapor deposition (CVD) or atomic layer deposition (ALD). In the embodiments of the present invention in which the conformal metal nitride layer 25 is deposited using chemical vapor deposition (CVD), the flow rate of precursor gasses may range from 5 sccm to 100 sccm, and the RF power may range from 0.05 kW to 15 kW. In one embodiment, the precursor may be inorganic based, such as $TiCl_4$, or in another embodiment the precursor may be organometallic based, such as tetrakis dimethylamino titanium (TDMAT) or tetrakis ethylmethyl amido titanium (TEMAT). Ammonia may be used as co-reactants to form the metal nitride. Further, in some embodiments, nitrogen or hydrogen-nitrogen, or ammonia plasma may also be used for post deposition treatment to lower the sheet resistance, densify and/or lower the carbon content and oxygen content of the film. In the embodiments of the present invention in which the conformal metal nitride layer 25 is deposited using atomic layer deposition (ALD), the precursors can be deposited at a temperature ranging from 50° C. to 650° C., and at the pressure ranging from 0.05 Torr to 30 Torr. Precursors used in CVD mode may also be used in ALD operations. In one example, instead of introducing the reactants simultaneously, a typical ALD operation involves flowing reactant A (e.g. $TiCl_4$) into the chamber to be adsorbed onto the wafer (typically at a thickness of 1 or a few monolayers, e,g, 5 monolayers). The chamber is then subjected to a vacuum to remove reactant A. Reactant B (e.g. $NH_3$) may then be introduced. Thereafter, the chamber may be subjected to a vacuum to remove the unreacted reactant B and the same sequence is repeated until the desirable metal nitride thickness is obtained. In some instances, an inert gas fill and pump step is introduced following the application of the vacuum that removes the unreacted reactant A, and before reactant B is introduced. For a typically TiN process, the pressure may range from 2 Torr to 10 Torr, and the wafer is heated to a temperature ranging from 400° C. to 600° C.

In one embodiment, a conformal metal nitride layer 25 deposited using chemical vapor deposition (CVD) or atomic layer deposition (ALD) has a resistance ranging from 150 μΩcm to 350 μΩcm. More typically, the conformal metal nitride layer 25 deposited using chemical vapor deposition (CVD) or atomic layer deposition (ALD) has a resistance ranging from 200 μΩcm to 300 μΩcm.

FIG. 6 depicts a non-conformal deposition of the electrically conductive material 30 overlying the conformal metal nitride layer 25, wherein the electrically conductive material 30 encloses the at least one trench 10. By depositing the electrically conductive material 30 on the conformal metal nitride layer 25 using a non-conformal deposition method. The electrically conductive material 30 may be comprised of polysilicon, doped polysilicon, titanium nitride (TiN), tantalum nitride (TaN), tantalum silicon nitride (TaSiN), tungsten nitride (WN) or a combination thereof In the embodiments in which the electrically conductive material 30 is provided by doped polysilicon, the dopant may be an n-type or p-type dopant having a dopant concentration ranging from $1\times10^{18}$ atoms/cm$^3$ to $1\times10^{20}$ atoms/cm$^3$.

The electrically conductive material 30 may be non-conformally deposited using physical vapor deposition (PVD), such as plating or sputtering, or may be non-conformally deposited using chemical vapor deposition (CVD). In one embodiment, the electrically conductive material 30 when composed of titanium nitride is deposited using physical vapor deposition (PVD) has a resistance ranging from 30 μΩcm to 50 μΩcm. Examples of chemical vapor deposition (CVD) that is suitable for forming the electrically conductive material 30 include, but at not limited to: Atmospheric Pressure CVD (APCVD), Low Pressure CVD (LPCVD), Plasma Enhanced CVD (EPCVD), Metal-Organic CVD (MOCVD), atomic layer deposition, and combinations thereof. In one embodiment, the electrically conductive material 30 when composed of titanium nitride (TiN) deposited using chemical vapor deposition (CVD) has a resistance ranging from 150 μΩcm to 300 μΩcm.

The non-conformal nature of the deposition method used to form the electrically conductive material 30 fills an upper portion of the at least one trench 10 enclosing a void 45 in a lower portion of the at least one trench 10. The volume of the void 45 may range from 5 nm$^3$ to 50 nm$^3$. More typically, the volume of the void 45 which is formed may range from 15 nm$^3$ to 30 nm$^3$.

Figure 7:
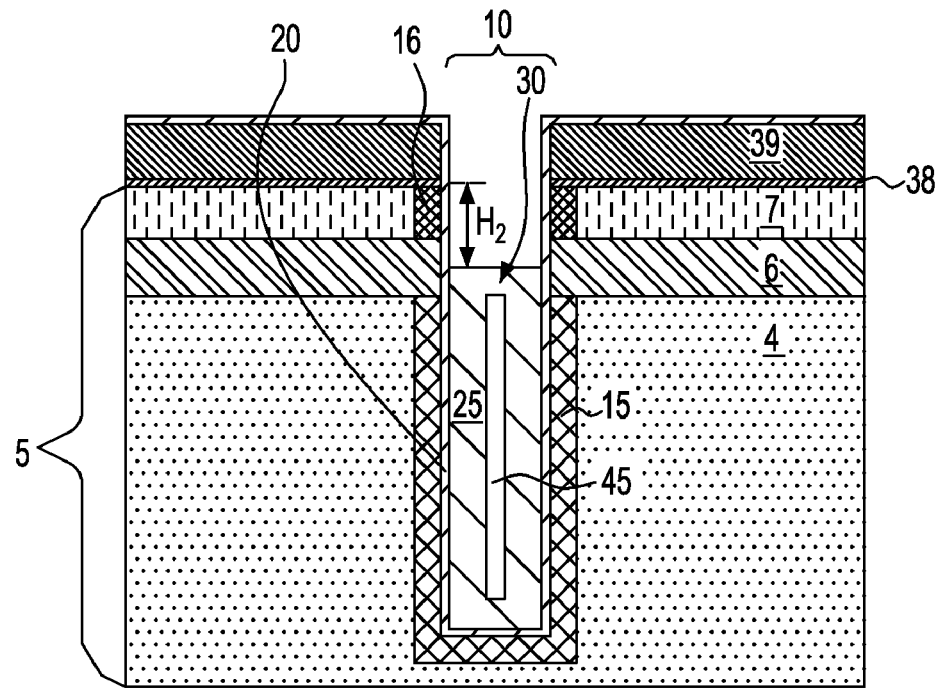
FIG. 7 is a side cross-sectional view depicting recessing the electrically conductive material in the at least one trench below an upper surface of the semiconductor substrate, in accordance with the present invention.

FIG. 7 depicts recessing the electrically conductive material 30 in the at least one trench 10 below an upper surface of the semiconductor substrate 5. The electrically conductive material 30 may be recessed with an anisotropic etch process, such as reactive ion etch (RIE). In one embodiment, the electrically conductive material 30 is recessed below the upper surface of the buried insulating layer 6 of the semiconductor substrate 5. The upper surface of the electrically conductive material 30 may be recessed below the upper surface of the semiconductor substrate 5 by a dimension $H_2$ ranging from 20 nm to 500 nm. More typically, the upper surface of the electrically conductive material 30 may be recessed below the upper surface of the semiconductor substrate 5 by a dimension $H_2$ ranging from 50 nm to 230 nm.

Figure 8:
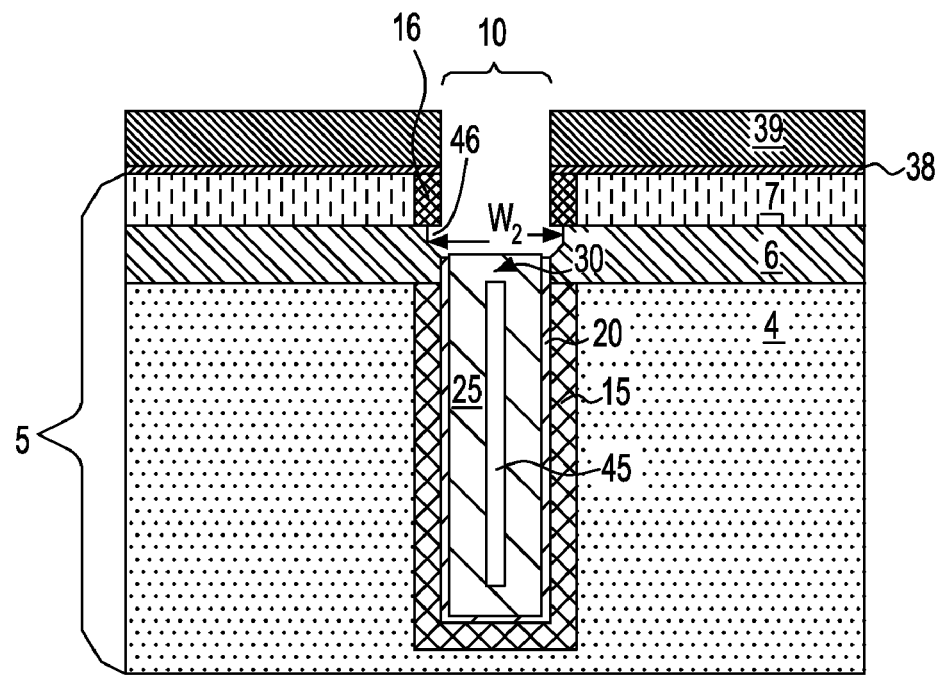
FIG. 8 is a side cross-sectional view depicting etching the conformal dielectric layer in the portion of the at least one trench above the recessed electrically conductive material, in accordance with the present invention.

FIG. 8 is a side cross-sectional view depicting etching the conformal dielectric layer 25 in the portion of the at least one trench 10 that is above the recessed electrically conductive material 30, and laterally etching the buried insulating layer 6 to provide an undercut region 46 underlying the semiconductor on insulator layer 7. In one embodiment, the step of etching the conformal dielectric layer 20 includes an etch process that removes the material of the conformal dielectric layer 20 selective to at least the electrically conductive material 30 and the semiconductor on insulator layer 7 of the semiconductor substrate 5. In a following process step, a lateral etch removes a portion of the exposed buried insulator layer 6 to provide the undercut region 46. Lateral etching means that the material of the buried insulator layer 6 is being removed in a direction parallel to the upper surface of the semiconducting substrate 5. In one embodiment, lateral etching is provided by an isotropic etch process, such as a wet etch. In another embodiment, chemical oxide etch removal is used to etch an oxide-containing buried insulator layer 6 selective to a silicon-containing semiconductor on insulator layer 7. The COR processing step includes exposing the structure to a gaseous mixture of HF and ammonia at a pressure of about 30 mTorr or below, and a temperature of about 25° C. The ratio of gaseous HF to gaseous ammonia is from 1:10 to 10:1.

The portion of the at least one trench 10 in which the undercut region 46 is present has a width $W_2$ ranging from about 0 nm to 50 nm. More typically, the portion of the at least one trench 10 in which the undercut region 46 is present has a width $W_2$ ranging from about 0 nm to 20 nm. Even more typically, the portion of the at least one trench 10 in which the undercut region 46 is present has a width $W_2$ ranging from about 0 nm to 5 nm.

Figure 9:
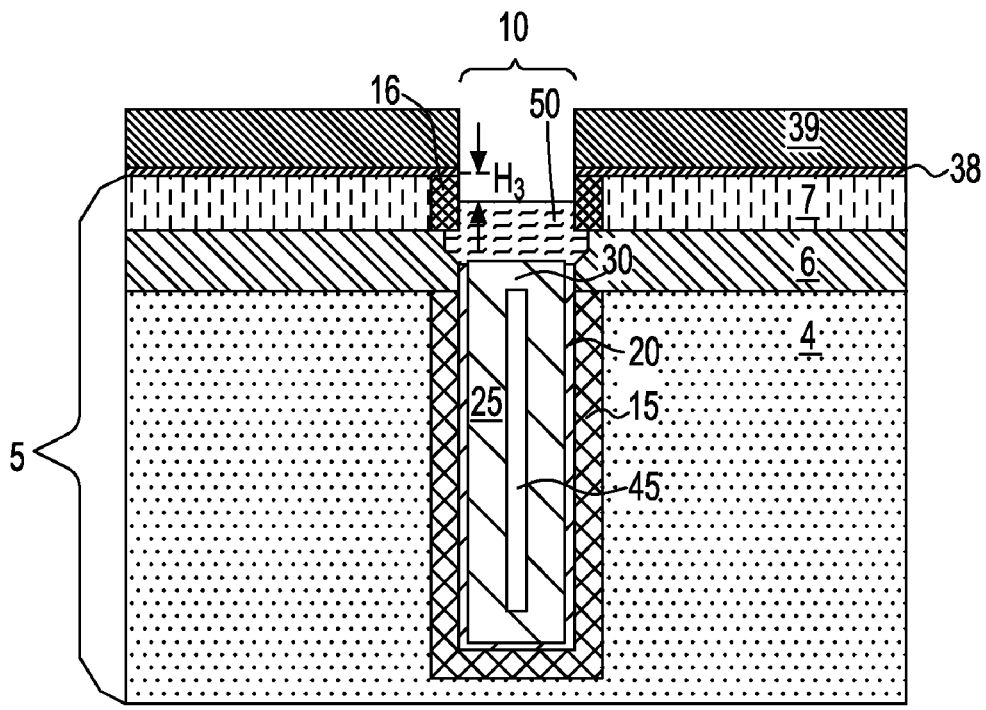
FIG. 9 is a side cross-sectional view depicting forming doped polysilicon atop the recessed electrically conductive material, in accordance with the present invention.

FIG. 9 depicts forming a doped polysilicon region 50 atop the recessed electrically conductive material 30. In one embodiment, the doped polysilicon region 50 is formed by first depositing a layer of polysilicon atop the recessed electrically conductive material 30; recessing the polysilicon layer utilizing an etching process, and then doping the recessed polysilicon layer via ion implantation. The polysilicon layer may be deposited using chemical vapor deposition (CVD). The polysilicon layer may be recessed using an anisotropic etching process, such as reactive ion etch, wherein the upper surface of the polysilicon layer is below at least the upper surface of the doped electrically conductive region 16 of the semiconductor on insulator layer 7 of the semiconductor substrate 5. In one embodiment, the polysilicon layer may be recessed so that the upper surface of the doped polysilicon region 50 is separated from the upper surface of the semiconductor on insulator layer 7 of the semiconductor substrate 5 by a dimension $H_3$ ranging from 30 nm to 50 nm. The recessed polysilicon layer may then be doped by ion implantation with an n-type or p-type dopant. A typical implant dose for providing the doped polysilicon region 50 is from $1 \times 10^{15}$ cm$^{-2}$ to $5 \times 10^{16}$ cm$^{-2}$. A typical implant energy range for providing the doped polysilicon region 50 is from 1 to 20 keV.

Figure 10:
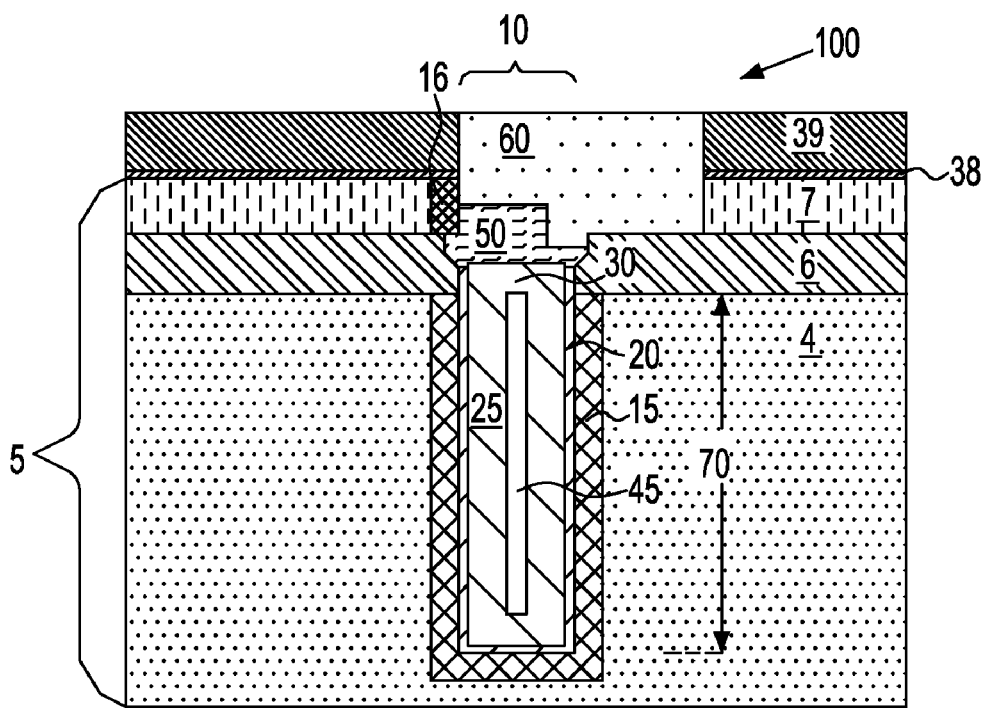
FIG. 10 is a side cross-sectional view depicting forming an isolation region, in accordance with the present invention.

In a following process step, an isolation region 60, such as a trench top oxide (TTO), is formed overlying the memory device 100. Forming the isolation region 60 may include an etch process to extend the width of the at least one trench in the second pad dielectric 39, the first pad dielectric 38, and the semiconductor on insulator 7 on one side of the at least one trench 10, as depicted in FIG. 10. Thereafter, the isolation region 60 is formed overlying the doped polysilicon region 50 utilizing a deposition processes such as high-density plasma-assisted chemical vapor deposition to deposit an oxide containing material. In a following process step, the oxide is then planarized to be coplanar with the upper surface of the second pad dielectric 39, as depicted in FIG. 10.

Still referring to FIG. 10, in one embodiment, the above-described method produces a memory device 100 that may include at least one trench 10 located in a semiconductor substrate 5 having an aspect ratio of about 3:1 or greater. A lower electrode 15 is present in the at least one trench 10 and a conformal dielectric layer 20 on the lower electrode 15. An upper electrode including a conformal metal nitride layer 25 is located on the conformal dielectric layer 20 in a lower portion 70 of the at least one trench 10, the conformal metal nitride layer 25 and an electrically conductive material 30 capping the conformal metal nitride layer 25. A void 45 is enclosed in the lower portion 70 of the at least one trench 10. It is noted that the components of the structure have been described above. In the final structure, the lower portion 70 of the trench is measured from the base of the at least one trench 10, wherein the upper portion of the at least one trench 10 extends from the interface of the electrically conductive material 30 and the conformal metal nitride layer 25.

In one embodiment, the present invention meets the conductivity requirements for the electrodes, i.e., the lower electrode 15 and upper electrode 25, 30 of the memory device, while providing for enhanced manufacturing. For example, the conformally deposited metal nitride layer 25 ensures that a portion of the upper electrode is formed atop the conformal dielectric layer 20, and the electrically conductive material 30 ensures expedient capping of the conformal dielectric layer 20, wherein the conductivity of the conformal metal nitride layer and the electrically conductive material 30 exceeds the conductivity of prior devices incorporating electrodes composed of doped polysilicon.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim is new and desire to secure by the Letters Patent is:

1. A method for forming a memory device comprising:
   forming a lower electrode in at least one trench, said trench is located in a semiconductor substrate;
   forming a conformal dielectric layer on the lower electrode; and
   forming an upper electrode on the conformal dielectric layer, wherein the forming of the upper electrode comprises a conformal deposition of a metal nitride layer, and a non-conformal deposition of an electrically conductive material atop the metal nitride layer, wherein the electrically conductive material encloses the at least one trench.

2. The method of claim 1, wherein forming the lower electrode in the at least one trench comprises ion implantation of n-type or p-type dopants into the semiconductor substrate.

3. The method of claim 1, wherein the forming of the conformal dielectric layer comprises chemical vapor deposition.

4. The method of claim 3, wherein the forming of the conformal dielectric layer is provided by atomic layer deposition.

5. The method of claim 1, wherein the metal nitride layer is comprised of titanium nitride (TiN), tantalum nitride (TaN), tantalum silicon nitride (TaSiN), tungsten nitride (WN) or a combination thereof.

6. The method of claim 5, wherein the conformal deposition of the metal nitride layer comprises chemical vapor deposition.

7. The method of claim 6, wherein the conformal deposition of the metal nitride layer comprises atomic layer deposition.

8. The method of claim 1, wherein the electrically conductive material is comprised of polysilicon, doped polysilicon, titanium nitride (TiN), tantalum nitride (TaN), tantalum silicon nitride (TaSiN), tungsten nitride (WN), molybdenum nitride (MoN) or a combination thereof.

9. The method of claim 8, wherein the non-conformal deposition of the electrically conductive material comprises physical vapor deposition.

10. The method of claim 1, wherein the conformal dielectric layer comprises of $HfO_2$, hafnium silicate, hafnium silicon oxynitride or combinations thereof.

11. The method of claim 1, wherein forming the lower electrode in the at least one trench comprises conformal deposition of a metal nitride layer.

\* \* \* \* \*